(12) United States Patent
Watanabe et al.

(10) Patent No.: US 7,126,448 B2
(45) Date of Patent: Oct. 24, 2006

(54) SUPERCONDUCTING MAGNET APPARATUS AND MAGNETIC RESONANCE IMAGING APPARATUS USING THE SAME

(75) Inventors: Hiroyuki Watanabe, Hitachi (JP); Masanori Takahashi, Mito (JP); Mitsushi Abe, Hitachinaka (JP); Jun Kawamura, Hitachinaka (JP)

(73) Assignees: Hitachi, Ltd., Tokyo (JP); Hitachi Engineering Co., Ltd., Ibaraki (JP)

(*) Notice: Subject to any disclaimer, the term of this patent is extended or adjusted under 35 U.S.C. 154(b) by 0 days.

(21) Appl. No.: 11/101,464

(22) Filed: Apr. 8, 2005

(65) Prior Publication Data

US 2005/0190030 A1 Sep. 1, 2005

Related U.S. Application Data

(63) Continuation of application No. 10/980,312, filed on Nov. 4, 2004.

(30) Foreign Application Priority Data

Nov. 17, 2003 (JP) .............................. 2003-386052

(51) Int. Cl.
*H01F 6/00* (2006.01)
(52) U.S. Cl. .................... 335/216; 335/301; 324/318; 324/320

(58) Field of Classification Search ................ 335/216, 335/296–306; 324/318–320
See application file for complete search history.

(56) References Cited

U.S. PATENT DOCUMENTS

| | | | | |
|---|---|---|---|---|
| 6,100,780 | A | * | 8/2000 | Dorri et al. .................. 335/216 |
| 6,166,617 | A | | 12/2000 | Laskaris et al. |
| 2003/0179060 | A1 | | 9/2003 | Wang et al. |

FOREIGN PATENT DOCUMENTS

| | | |
|---|---|---|
| EP | 0 937 994 A2 | 8/1999 |
| EP | 2003-061931 | 4/2003 |
| JP | 8-215171 | 8/1996 |
| JP | 10-097917 | 4/1998 |
| JP | 63-272335 | 11/1998 |
| JP | 2001-224571 | 8/2001 |

* cited by examiner

*Primary Examiner*—Ramon M. Barrera
(74) *Attorney, Agent, or Firm*—Mattingly, Stanger, Malur & Brundidge, P.C.

(57) ABSTRACT

An MRI apparatus includes magnet members for compensating the magnetic field which are disposed to a thermal shield system of the superconducting apparatus. The magnet members for compensating the magnetic field are disposed at positions where temperature change in the vacuum chamber is not transferred to the interior of the vacuum chamber.

7 Claims, 6 Drawing Sheets

SUPERCONDUCTING MAGNET APPARATUS AND MAGNETIC RESONANCE IMAGING APPARATUS USING THE SAME

CLAIM OF PRIORITY

The above-referenced patent application is a continuation application of U.S. Ser. No. 10/980,312 filed Nov. 4, 2004, from which priority is claimed under 35 U.S.C. § 120.

The present application claims priority from Japanese application No. 2003-386052, filed on Nov. 17, 2003, the content of which is hereby incorporated by reference into this application.

DESCRIPTION OF THE INVENTION

1. Technical Field

The present invention relates to a superconducting magnet apparatus and a magnetic resonance imaging apparatus using the same (hereinafter referred to as MRI apparatus) and more particularly to a superconducting magnet apparatus suitable for an open type MRI apparatus that does not give feeling of blockade to an examinee and to an MRI apparatus that utilizes the magnet apparatus.

2. Background of the Invention

In the conventional MRI apparatuses, magnets are disposed at positions where the superconducting magnet apparatus of the MRI apparatuses have the normal temperature or room temperature.

In another example of superconducting magnets of the MRI apparatus, a ferromagnetic magnet which is disposed in a coil container with which helium of ultra low temperature is filled is disclosed in Patent document 1.

Patent document 2 discloses a superconducting apparatus comprising a pair of vacuum containers opposite to each other wherein a magnetic field space is formed between the vacuum containers. An annular superconducting coil and a ferromagnetic magnet member are disposed in a cooling container (a coil container) disposed in a vacuum chamber. Further, a thermal shield is disposed between the vacuum chamber and the cooling container.

Patent document 3 discloses a superconducting magnet apparatus having an annular vacuum chamber surrounding the magnetic field. Magnet members for compensating the magnetic field are disposed outside the liquid helium tank. Since the magnet members are disposed to the vacuum chamber, they receive influence of thermal shrinkage or expansion of the vacuum chamber.

Patent document 4 discloses an electromagnet apparatus for use in a magnetic resonance imaging apparatus comprising an annular container accommodating annular coils and cooling iron block. The iron block is mechanically fixed to the coils.

(Patent document 1) Japanese Patent Laid-open 2001-224571
(Patent document 2) Japanese Patent Laid-open 10-97917
(Patent document 3) Japanese Patent Laid-open 63-272335
(Patent document 4) Japanese Patent Laid-open 8-215171

However, there are following problems if the magnets are disposed at the positions of the normal temperature of the superconducting magnet apparatus.

(1) The magnetic homogeneity of the magnetic field changes in accordance with a dimensional change of the magnet apparatus due to a temperature change when the magnet members are disposed at the position of the normal temperature.

(2) Vibration when GC (gradient coil) is applied or exterior vibration causes a change of a relative distance between the low temperature section of the superconducting magnet and the vacuum chamber. In this case, when the magnet members for compensating the magnetic field is located at the normal temperature position, a change of relative distance between the position of magneto-motive force at the low temperature position and the magnet members for compensating the magnetic field at the normal temperature.

Although disposing the magnet members in the vacuum containers with which ultra low temperature helium is filled may dissolve the above-mentioned problems, there is the following problem on the other.

Since the container filled with liquid helium is installed within thermal shields of a cryostat, the magnet members are located at the position remote from the center of the magnet by a distance of a gap between the thermal shield plates and the container filled with the liquid helium and a thickness of the container. Accordingly, since the effect of the magnet members on the center of the magnetic field decreases in accordance with the distance, the volume of the magnet members becomes larger resulting in an increase of the weight of the magnet members; in some cases, the compensation or correction of the magnetic field becomes difficult.

SUMMARY OF THE INVENTION

The present invention aims at solving the above-described problems, and its object is to provide a superconducting magnet apparatus and an MRI apparatus characterized in that the change of homogeneity of a generated magnetic field is minimized and even if the magnet members for compensating or correcting the magnetic field are utilized, an increase of the weight of the superconducting magnet apparatus is suppressed.

In order to achieve the object, one of the features of the present invention is resides in disposing the magnet members for compensating or correcting the magnetic field to the thermal shield plates of the superconducting magnet apparatus.

Further, in order to achieve the above-mentioned object, another feature of the present invention is by disposing the magnet members for compensating the magnetic field outside the coil containers and inside the vacuum container.

Furthermore, the superconducting magnet apparatus of the present invention for achieving the above-mentioned object is featured by disposing the magnet members for compensating the magnetic field outside the coil containers and at positions where temperature change is not transferred in the vacuum chamber.

According to the superconducting magnet apparatus, since it is possible to make minimum the magnetic field change due to room temperature change and vibration even when the magnet members for compensating the magnetic field are used, the MRI apparatus using the superconducting magnet with a high performance can be provided.

DESCRIPTION OF THE PREFERRED EMBODIMENTS

In the following, embodiments of the present invention will be explained by reference to drawings.

Figure 6:
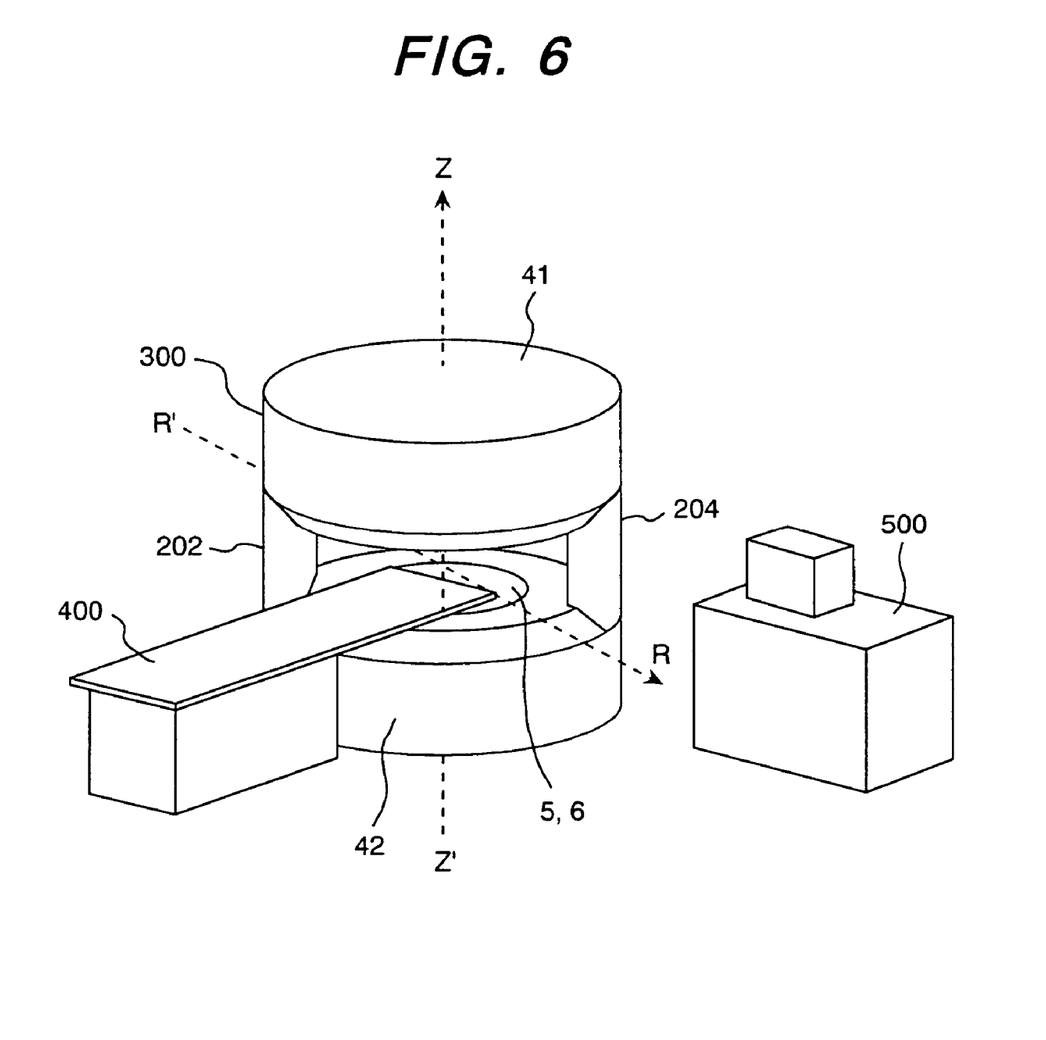
FIG. 6 is a perspective view of an MRI apparatus using the superconducting magnet apparatus according to the present invention.

An outline of the embodiment of the MRI apparatus according to the present invention is explained. The MRI apparatus comprises, as shown in FIG. 6, superconducting coils (not shown in FIG. 6), coil containers (not shown in FIG. 6) for accommodating the superconducting coils together with liquid helium as a coolant, a superconducting magnet 300 comprising vacuum chambers 41, 42 that surround the coil containers and the interior thereof is kept vacuum, a RF coil 5 and a gradient coil 6, a bed 400 for placing an examinee, and a control device 500 for analyzing nuclear magnetic signals from the examinee. Supporting members 202, 204 to be arranged support the vacuum chambers 41, 42 so as to separate them and to place them opposite to each other. A magnetic field is formed vertically in the space between the vacuum cambers 41, 42 thereby to carry out tomography of the examinee on the bed.

Then, an embodiment of the present invention that is employed in the MRI apparatus will be explained.

Figure 1:
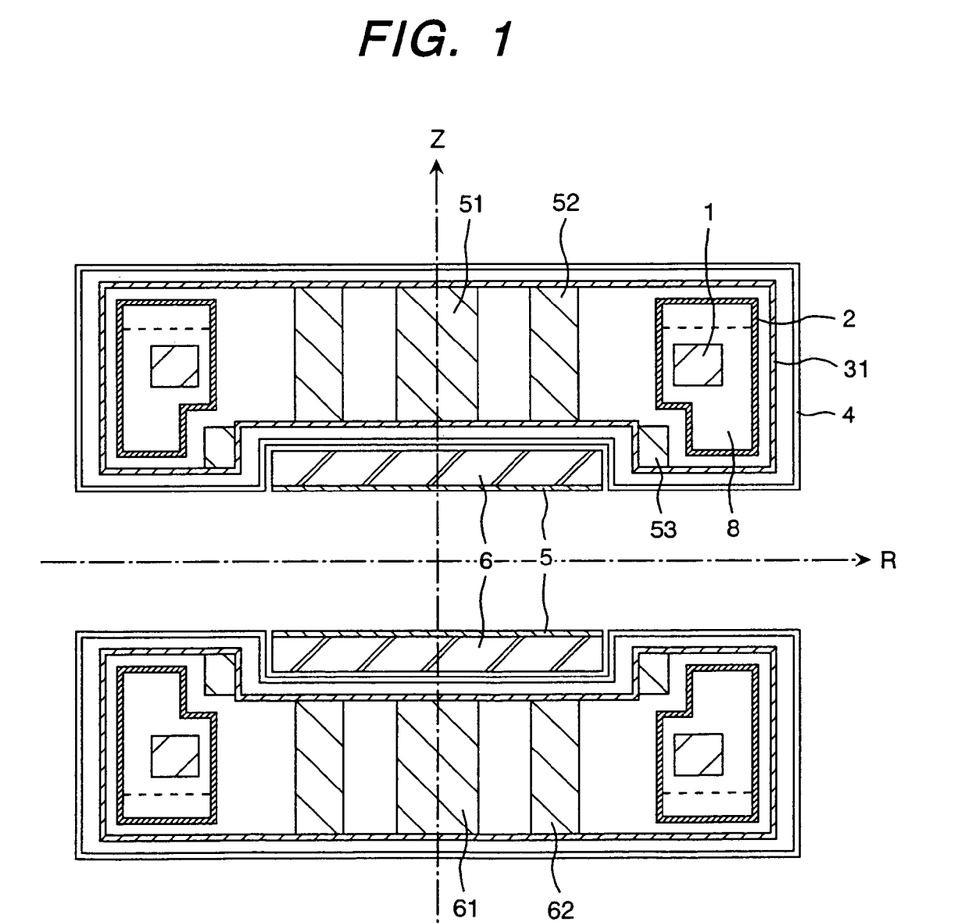
FIG. 1 is a cross sectional view of a first embodiment of the superconducting magnet apparatus according to the present invention.

FIG. 1 shows a structure of the superconducting magnet apparatus of the first embodiment, which is a cross sectional view from the plane which is formed by the center axis Z passing through the center of the superconducting magnet of the embodiment shown in FIG. 6 and an axis R intersecting the axis Z.

In the superconducting magnet apparatus shown in FIG. 1, liquid helium is accommodated in the coil containers 2, and annular superconducting coils 1 are dipped in the ultra low temperature liquid helium. The whole peripheries of the coil containers 2 are covered or surrounded with thermal shields 31 to isolate them from outside. Covering the thermal shields with vacuum chambers 4 forms a vacuum space between the atmosphere and the coil containers to assure heat insulation. The vacuum chambers facing the analytical space have recesses where gradient coils 6 are accommodated, and RF coils 5 are disposed in the recesses at the analytical space side.

In this structure of the apparatus, the magnet member 51 for compensating the magnetic field is disposed on the Z-axis, the shape of the magnet members being columnar or cylindrical. The annular magnet member 52 is disposed at the position of axial symmetry with respect to Z-axis and outside the magnet member 51. The magnet member 53 is disposed at a position of axial symmetry with respect to Z-axis outside the magnet member 52.

In the conventional superconducting magnet apparatus, since the magnet members are disposed to the vacuum chambers, the vacuum chambers may bring about thermal shrinkage or thermal expansion, so that the change of the position and dimension of the magnet members take place; thus it was difficult to secure stability of homogeneity of the central magnetic field. In the superconducting magnet apparatus of the present invention, however, it is possible to stably keep the magnetic homogeneity of magnetic field without receiving the influence of the shrinkage or expansion of the vacuum chamber 4 even if a temperature change brings about the thermal shrinkage or expansions, because the magnet members 51, 52, 53 are disposed by supporting them with thermal shield plates.

Figure 2:
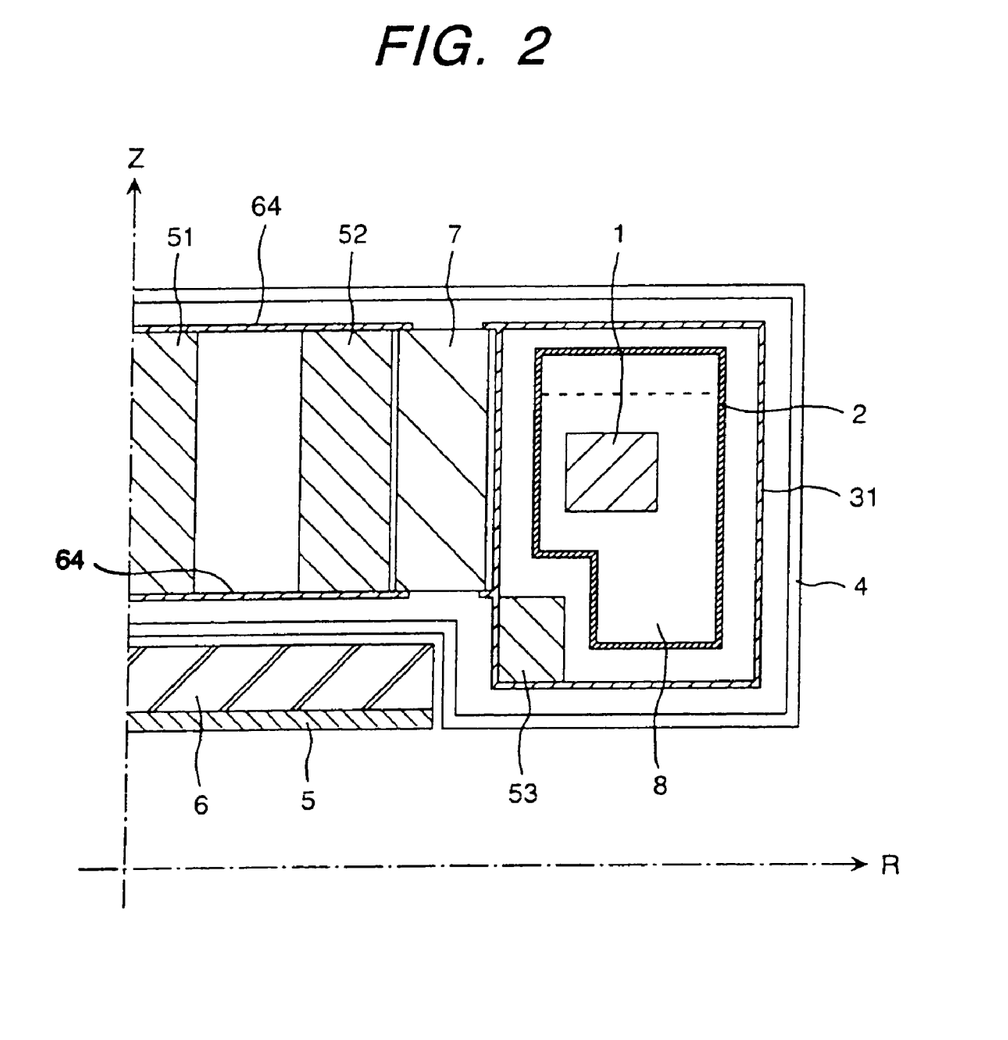
FIG. 2 is a cross sectional view of a second embodiment of the superconducting magnet apparatus according to the present invention.

FIG. 2 shows a second embodiment of the present invention.

In this embodiment, a cross sectional area confined by the central axis Z and axis R that intersects the axis Z of the sectional area through which the central axis Z and the axis R that intersects the axis Z is shown. Unless otherwise specified, the same reference numerals in FIG. 2 as those in FIG. 1 denote the same elements and same functions as those in FIG. 1.

In this embodiment, differing from the above-mentioned embodiment, the magnet members 51, 52 are not supported by the thermal shields 31 that cover or surround the coil containers 2, but supported by the thermal shields 64 made of the same material as that of the thermal shields 31. In other words, the thermal shields are divided into two parts in the direction of axis R. These magnet members 51, 52 and thermal shields 64 are supported by the thermal insulation plate 7 from the thermal shield 31. The structure of the thermal insulation plate 7 is constituted by a plurality of plates vertically arranged around the annular magnet member 52 through which the magnet members 51, 52 are supported from the thermal shield 31. Instead of the thermal insulation plate 7, an annular thermal insulation member can be utilized; it will bring about the same function and effect as the thermal insulation plate. Further, instead of the thermal shields 64, which are made of the same material as the thermal shield 31, the thermal shields made of a different material may be employed.

According to this embodiment, since the magnet members 51, 52 are integrated or united with the thermal shield 31 through the thermal insulation plate 7, the same effects as those of the first embodiment are expected. Further, when the magnet members 51, 52 are supported through the thermal insulation plate 7, heat of the magnet members 51, 52 transferred to the thermal shield 31 is little so that the magnet apparatus can be operated under such condition that the temperature of the magnet members 51, 52 is higher than that of the thermal shield 31. As a result, an entry amount of radiation heat from the vacuum container 4 into the magnet members 51, 52 is smaller that that of the embodiment shown in FIG. 1 wherein the magnet members are integrated with the shield plate. The reduced radiation heat entry into the thermal shield 31 lowers burden on a refrigerator (not shown) for cooling liquid helium so that a sufficient margin of the refrigerator in view of the system design can be secured.

Figure 3:
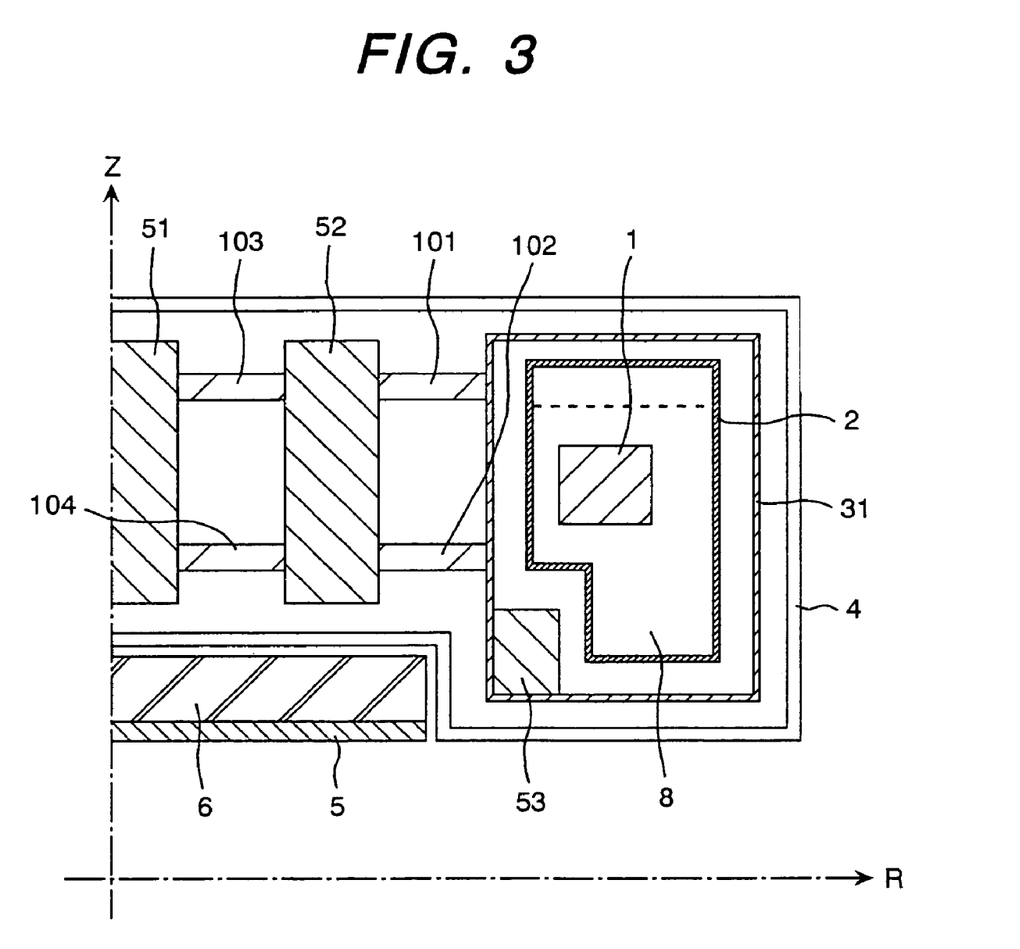
FIG. 3 is a cross sectional view of a third embodiment of the superconducting magnet apparatus according to the present invention.

FIG. 3 shows a third embodiment. In this embodiment, as same as in the second embodiment, a cross sectional area confined by the central axis Z and axis R that intersects the axis Z of the sectional area through which the central axis Z and the axis R that intersects the axis Z is shown. Unless otherwise specified, the same reference numerals in FIG. 2 as those in previous embodiments denote the same elements and same functions as in previous embodiments.

In this embodiment, the magnet member 52 is supported at several points by thermal insulation supporters 101, 102 from the thermal shield 31. The magnet member 51 is also supported at several points of the outer peripheries thereof by the thermal insulation supporters 103, 104. The magnet members 51, 52 are supported from the thermal insulation supporters 101, 102, 103, 104 in this embodiment. The configuration of the thermal insulation supporters 101, 102, 103, 104 can be annular or rod form to obtain the same effects and same functions, instead of the plate form.

According to this embodiment, since the magnet members 51, 52 are integrated or united with thermal shield 31 through the thermal insulation supporters 101, 102, 103 and 104, the same functions and effects as described before will be expected. Further, since provision of the thermal insulation supporters makes an amount of heat transferred from the magnet members 51, 52 to the thermal shield 31 small, operation of the apparatus under a condition that the temperature of the magnet members 51, 52 is higher than that of the thermal shield 31 becomes possible. As a result, an amount of radiation heat entry from the vacuum chamber into the magnet members 51, 52 is smaller than that of the first embodiment shown in FIG. 1 wherein the magnet members are integrated by the shield plate. The reduced radiation heat entry into the thermal shield 31 lowers a burden on the refrigerator (not shown), and it is possible to secure a margin of the refrigerator from the viewpoint of system design.

Figure 4:
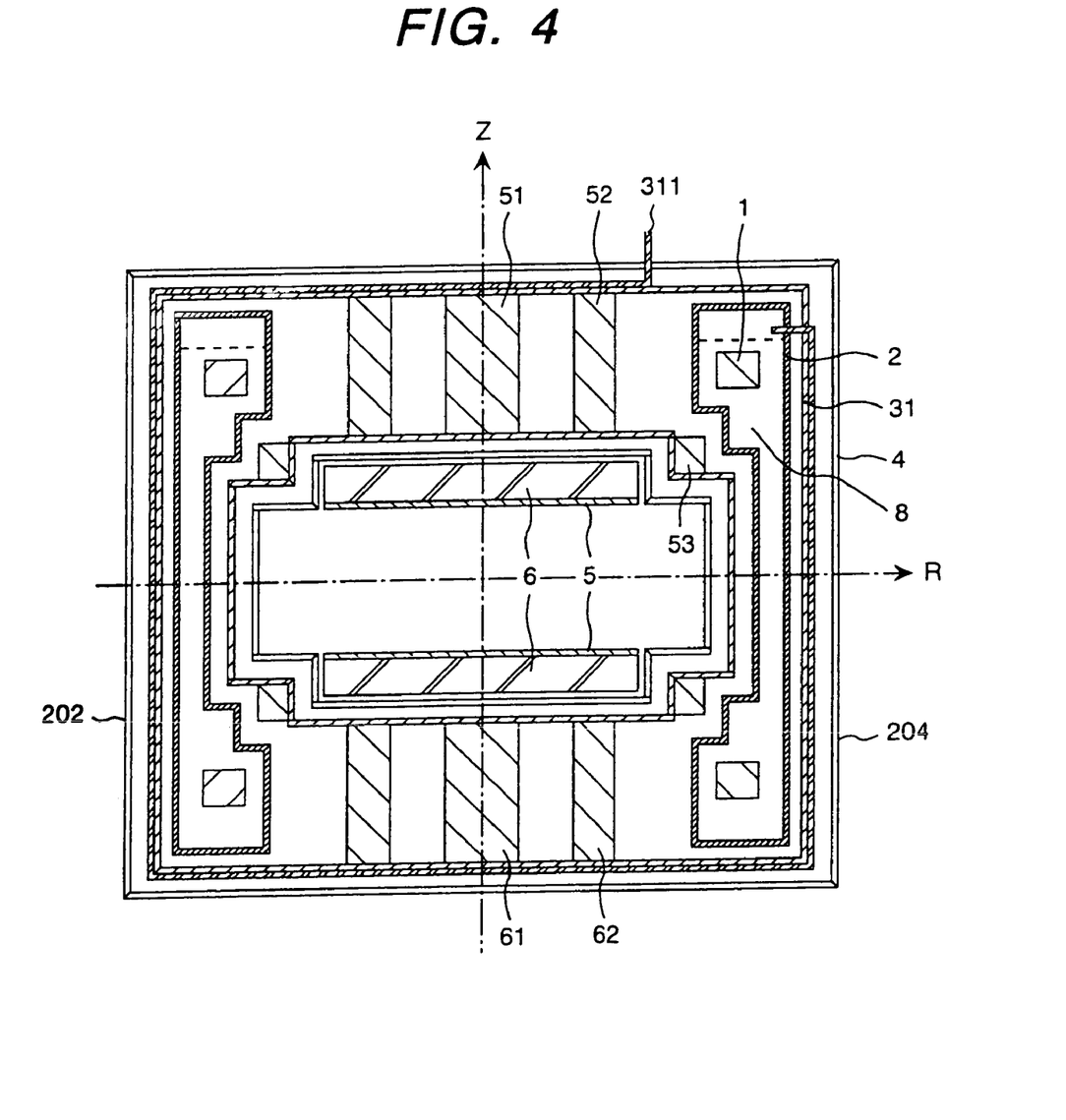
FIG. 4 is a cross sectional view of a fourth embodiment of the superconducting magnet apparatus according to the present invention.

FIG. 4 shows a fourth embodiment of the present invention.

FIG. 4 shows a cooling system for the thermal shield wherein a cross sectional view of a superconducting magnet apparatus for the MRI apparatus shown in FIG. 6 is along with the center axis Z and the supporting members 202, 204.

In this embodiment, a coolant conduit 311 for the thermal shield is connected to the coil container 2 so as to guide evaporated helium gas to outside the apparatus. From the connecting points, the coolant conduit 311 extends downward in the supporter 204 along the thermal shield 31. The conduit 311 extends along the surface of the thermal shield 31 near the magnet members 61, 62 disposed in the vacuum chamber 42 so as to cool the magnet members 61, 62; the conduit 311 further extends upward in the supporter 202 along the surface of the thermal shield 31 to cool the magnet members 51, 52 disposed in the upper vacuum chamber 41. The conduit 311 is finally connected to outside the vacuum chamber.

In the apparatuses wherein magnet members are disposed to the thermal shields like the apparatus of the present invention, if the thermal shield plates and magnet members are cooled by conduction cooling from the refrigerator as is done in the conventional apparatuses, it will take a long time for initial cooling of the magnet members because of a large thermal volume of the magnet members. However, if the evaporated gas that is produced when coolant is poured in the coil containers is utilized for cooling the thermal shield near the magnet members, it is possible to shorten the time for initial cooling.

Figure 5:
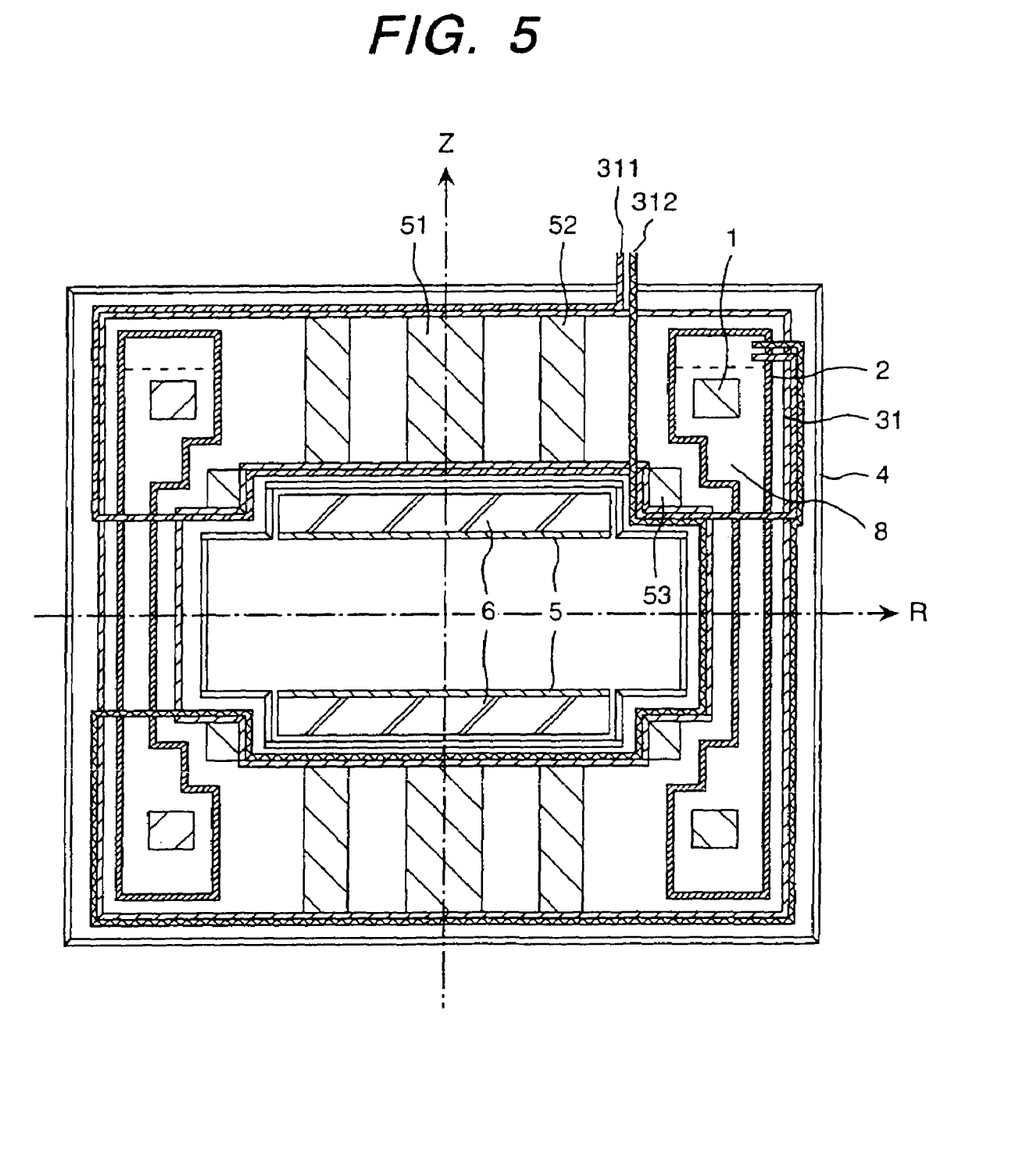
FIG. 5 is a cross sectional view of a fifth embodiment of the superconducting magnet apparatus according to the present invention.

The coolant conduit can be divided as shown in FIG. 5. In this embodiment, the apparatus is provided with coolant conduits 311, 312 for cooling the thermal shields. The coolant conduits 311, 312 are connected with the coil containers 2 so as to guide evaporated helium gas to outside the apparatus. From the connecting points, the coolant conduit 311 is disposed along the thermal shield 31 that faces the gradient coil 6 so as to cool the thermal shield 31 disposed in the upper vacuum chamber 41. Thus, the conduit extends along the thermal shield and is connected with outside the apparatus. The coolant conduit 312 extends downward along the thermal shield 31 in the support member 204. The conduit further extends downward along the lower part of the thermal shield 31 of the lower vacuum chamber 42, and extends along the thermal shield 31 that faces gradient magnetic field coil or gradient coil 6 along the thermal shield 31. Finally, the conduit extends upward in the support 204 and connected to outside the apparatus.

In case where the volume of the magnet members is large, it will take a long time to cool the magnet members until the temperature arrives at the predetermined temperature by a single conduit, because there is a temperature difference between the thermal shields, the lower thermal shield shown in FIG. 5, which is cooled in the beginning and the upper thermal shield, which is cooled later, for example. However, according to this embodiment, since the magnet members in the upper and lower vacuum chambers are cooled separately; the cooling time to arrive at the predetermined temperature will be shortened.

The construction of the coolant conduits may be applied to the embodiments shown in FIGS. 2 and 3. In the apparatus shown in FIG. 2, the coolant conduit is disposed along the thermal shields 62 thereby to cool the magnet members; in the apparatus shown in FIG. 3, the conduit is disposed along the magnet members thereby to directly cool the magnet members.

More concrete structures of the superconducting magnet apparatus of the present invention are as follows.

The superconducting magnet apparatus, which comprises a pair of upper and lower magnet units each comprising an annular superconducting coil; an annular coil container for accommodating the annular superconducting coil together with a coolant; a first magnet member extending along the center axis Z of the magnet unit and located on the center axis Z; an annular second magnet member disposed in an axial symmetric relation with respect to the first magnet member; a thermal shield so disposed as to surround the coil container, the first magnet member and the second magnet member; and a vacuum chamber surrounding the thermal shield with a vacuum gap between the thermal shield and the vacuum container, the interior of the vacuum chambers being kept vacuum; wherein the magnet units constitute to form a magnetic space or a magnetic field therebetween, and wherein the first and second magnet members for compensating or correcting the magnetic field are fixed to the thermal shields. The magnetic shields can be divided into two parts as shown in FIG. 2. In another embodiment as shown in FIG. 3, the thermal shield covering the magnet members are removed.

In the superconducting magnet apparatus described above, each of the magnet units further comprises a third magnet member disposed near the magnetic space and outside the second magnet member.

Further, in the superconducting magnet apparatus, each of the magnet units further comprises a gradient coil at a position facing the magnetic space.

What is claimed is:

1. A superconducting magnet apparatus comprising annular superconducting coils; coil containers for accommodating the annual superconducting coils together with a coolant; thermal shields so disposed as to surround the coil containers; and a vacuum chamber(s) surrounding the coil containers and the thermal shields surrounding the coil containers, the interior of the vacuum chamber being kept under a vacuum; wherein the coil containers are so arranged as to oppose each other to form a magnetic space there between, and wherein magnetic members for compensating a magnetic field in the magnetic space are disposed to thermal shields separated from the thermal shields surrounding the coil containers.

2. The superconducting magnet apparatus according to claim 1, wherein the magnetic members for compensating the magnetic field are supported by supporting members from the thermal shields surrounding the coil containers.

3. A magnetic resonance imaging apparatus that uses the superconducting magnet apparatus according to claim 1.

4. A superconducting magnet apparatus comprising annular superconducting coils; coil containers for accommodating the superconducting coils together with a coolant; thermal shields so disposed as to surround the coil containers; and a vacuum chamber surrounding the coil containers and the thermal shields surrounding the coil containers, the interior of the vacuum chamber being kept under a vacuum, wherein coil containers are disposed to oppose each other to form a magnetic field therebetween, wherein annular magnetic members for compensating a magnetic field in a magnetic space between the coil containers are disposed outside the coil containers but in the vacuum chambers, and wherein the annular magnetic members are supported by supporting members, which are made of thermal insulating material.

5. The superconducting magnet apparatus according to claim 4, wherein other annular magnetic members for compensating the magnetic field are disposed at a first position of axial symmetry with respect to the Z-axis and at a second position outside the thermal shields but inside the vacuum chambers.

6. The superconducting magnet apparatus according to claim 4, which further includes cooling conduits for cooling the superconducting magnet apparatus.

7. The superconducting magnet apparatus according to claim 4, wherein the magnetic members are located at the axis symmetric position with respect to the center axis of the magnetic space formed between the coil containers.

* * * * *